United States Patent
Chapman

[11] Patent Number: 6,010,929
[45] Date of Patent: Jan. 4, 2000

[54] METHOD FOR FORMING HIGH VOLTAGE AND LOW VOLTAGE TRANSISTORS ON THE SAME SUBSTRATE

[75] Inventor: Richard A. Chapman, Dallas, Tex.

[73] Assignee: Texas Instruments Incorporated, Dallas, Tex.

[21] Appl. No.: 08/988,641

[22] Filed: Dec. 11, 1997

Related U.S. Application Data

[60] Provisional application No. 60/033,041, Dec. 11, 1996.

[51] Int. Cl.$^7$ ............................................... H01L 21/8238
[52] U.S. Cl. ........................................... 438/226; 438/275
[58] Field of Search ..................................... 438/226, 275

[56] References Cited

U.S. PATENT DOCUMENTS

| | | |
|---|---|---|
| 4,530,150 | 7/1985 | Shirato . |
| 5,105,252 | 4/1992 | Kim et al. . |
| 5,438,008 | 8/1995 | Ema . |
| 5,465,005 | 11/1995 | Eklund et al. ............................ 257/538 |
| 5,468,666 | 11/1995 | Chapman ................................... 437/44 |
| 5,527,722 | 6/1996 | Hutter et al. . |
| 5,580,805 | 12/1996 | Kuroda . |
| 5,834,352 | 8/1998 | Choi . |
| 5,837,572 | 11/1998 | Gardner et al. . |
| 5,882,973 | 1/1997 | Gardner et al. . |

OTHER PUBLICATIONS

Cacharelis et al "A 1.0 BiMOS with EEPROM technology for application in the design of "smart" analog and Mixed–signal ASIC products," IEEE 1992 Custom Integrated Circuits Conference, 9.7.1–9.7.4, 1992.

Chapman et al "High performance sub–half micron CMOS using rapid thermal processsing" IEEE IEDM, p. 101–104, 1991.

Primary Examiner—John F. Niebling
Assistant Examiner—Jonathan Hack
Attorney, Agent, or Firm—Wade James Brady III; Richard L. Donaldson

[57] ABSTRACT

A process for forming high voltage and low voltage transistors on the same substrates includes first forming a poly gate (16) over layer gate oxide (10) on a substrate (12). An LDD implant is then performed, followed by the formation of a nitride cap (30) over the gate (16). The cap (30) is not disposed over gate electrodes associated with low voltage transistors. Thereafter, the source/drain implant is performed which forms source/drain regions (40) and (42). The cap (30) prevents the introduction of dopants into the gate electrode (16) during the source/drain implant step. This effectively increases the gate oxide width due to a larger depletion region at the oxide/polysilicon gate boundary as compared to the low voltage transistors with the higher dopant levels and the gate electrode.

12 Claims, 2 Drawing Sheets

METHOD FOR FORMING HIGH VOLTAGE AND LOW VOLTAGE TRANSISTORS ON THE SAME SUBSTRATE

This application claims priority under 35 USC §119(e)(1) of provisional application number 60/033,041 filed Dec. 11, 1996.

TECHNICAL FIELD OF THE INVENTION

The present invention pertains in general to a process for manufacturing a CMOS transistor and, more particularly, to a process for manufacturing a high voltage transistor on the same substrate as a low voltage transistor.

BACKGROUND OF THE INVENTION

Integrated circuit operating voltages are being rapidly decreased to permit the use of shorter gate length transistors and to obtain lower power consumption. However, a total system typically requires the use of several integrated circuit chips, some of which will be older designs using higher voltage. Thus, many customers request that the new low voltage chips include input/output circuits that interface with the higher voltage chips. Having transistors designed for two different voltages increases the cost of the process and added process steps also decrease yield.

CMOS transistors are manufactured with a process whereby a layer of gate oxide is disposed over a defined active region in the substrate, followed by the formation of a gate electrode over the gate oxide. Thereafter, source and drain regions are formed on either side of the gate electrode with a self-aligned process to form a channel region therebetween. As technology has advanced, the oxide thicknesses have been reduced to thickness on the order of 20 to 100 Angstroms for small signal devices. However, when the oxide thickness is reduced to such levels, the breakdown voltage for these transistors becomes rather small. For most small signal applications on a particular integrated circuit, this oxide thickness and breakdown voltage can be tolerated. However, when high voltage transistors are incorporated on the same substrate with the lower voltage transistors, this results in a mix of high voltage and low voltage transistors.

In U.S. Pat. No. 5,468,666, issued Nov. 26, 1995, to R. A. Chapman, which patent is incorporated herein by reference, a process is disclosed whereby high voltage and low voltage transistors are formed on the same substrate. In order to form both types of transistors, different doping levels were employed in the gate electrodes of the transistors to determine whether the transistor was a high voltage transistor or a low voltage transistor. Since the thickness of the depletion region that forms adjacent the gate oxide within the gate electrode is dependent upon the doping level, by varying this doping level, the effective oxide thickness can be varied. If the doping level is decreased, the effective oxide thickness will increase and, subsequently, the breakdown voltage of the transistor will increase.

In the Chapman patent, the variation of the doping level between transistors on the same substrate having a gate formed in the same layer is achieved by a masking process. Prior to defining and etching the gate electrodes in the polycrystalline silicon layer, the gates of the low voltage transistors were exposed and an implant made into the polycrystalline silicon layer. However, subsequent processing resulted in the formation of the source/drain implants, which required more dopants to be implanted into the substrate. At this point in the process, the upper surfaces of the gate electrodes were not protected and additional dopants associated with the source/drain implant operation were implanted into all of the transistors, both low voltage and high voltage transistors.

Two additional methods that have been utilized to manufacture different transistor types for two different supply voltages are (1) the split gate oxide method utilizing two different gate oxide thicknesses with one poly gate level and (2) a double poly process with different gate oxide thicknesses each under a different poly level. The split gate oxide process requires that a resist patterning be made on one of the gate oxides such that this initial gate oxide can be etched off some regions of the chip before a second gate oxide is grown. This patterning of resist lowers yield and reliability of the first gate oxide and requires special equipment for etch of gate oxide in the present resist. Logic circuits seldom utilize more than one poly level unless some type of SRAM memory is fabricated that has poly resistor loads or stacked active loads. If an extra poly deposition is added for input/output circuits, process yield will be lower to some extent. One of the most significant problems is the formation of second level poly filaments adjacent to the first level poly gates. These second level filaments are created along the edges of the first level poly at the time of the anisotropic etch of the second level poly. Extreme over etch of the second poly may be required and this etch could break through the first gate oxide where there is no first level poly. Another approach is to oxidize the filaments, but this process may oxidize too much of the first and second level poly gates. A double level poly process introduces much more difficulty than a simple x2 to a single level poly process.

SUMMARY OF THE INVENTION

The present invention disclosed and claimed herein describes a process for forming high voltage and low voltage transistors on a single substrate. A plurality of gate electrodes is first formed on the surface of the substrate, each in defined active regions and each overlying a channel region and separated therefrom by a gate oxide layer. Source/drain regions are implanted on either side of the gate electrode of each of the transistors to form source/drain regions. The introduction of dopants into the gate electrodes of the transistors defined as the high voltage transistors is inhibited to a substantial degree to reduce the dopants therein relative to the gate electrodes of the low voltage transistors, such that a larger depletion region is formed at the oxide/electrode boundary in the presence of high voltages.

In another aspect of the present invention, the inhibiting operation is provided by forming a protective cap over the gate electrodes in the ones of the gate electrodes associated with high voltage transistors prior to the step of implanting. This cap is formed of a nitride layer which is first formed over the substrate and then patterned and etched to cover only the gate electrodes of the transistors designated as high voltage transistors.

In a further aspect of the present invention, the step of patterning the nitride layer is performed such that the cap covers the top and sides of the electrode of the high voltage transistors and extends outward from the edges therefrom a predetermined distance. This cap is formed prior to the implanting step, such that the extensions form a mask for the implant to space the source/drain regions away from the edge of the gate electrode. Prior to performing the source/drain implant and forming the cap, a Lightly Doped Drain (LDD) implant is performed to provide a connection between the source/drain regions and the channel. This is a self-aligned process.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
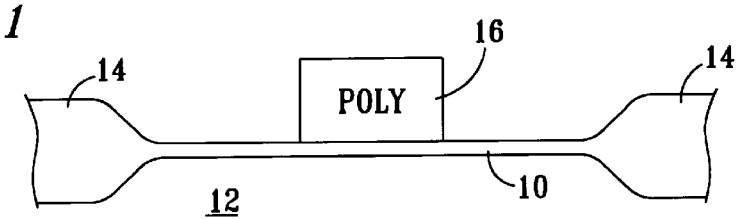
FIG. 1 illustrates the formation of the poly gate electrode over the gate oxide.

Referring now to FIG. 1, there is illustrated a semiconductor substrate that is processed up to the step of forming the gate electrode. Initially, conventional processing of either a P-channel transistor or an N-channel transistor requires the formation of an active region. This is formed by separating select regions from each other with a field oxide. Once the field oxide has been formed around the regions, the oxide layer on the surface thereof is removed down to the surface of the silicon substrate and then a layer of gate oxide formed thereon to a thickness of approximately 20 to 100 Angstroms. This is followed by the deposition of a layer of polycrystalline silicon over the substrate, this being a conformal layer. This layer is then patterned with a layer of resist and etched to form the gate electrodes therein. This gate electrode is formed from a polycrystalline silicon layer that has a thickness that is approximately 0.15–0.25 microns in thickness. This will result in the formation of a layer of gate oxide 10 that is disposed in an active region 12 that is formed on either side thereof by a field oxide region 14. A gate electrode 16 is then formed on the upper surface thereof within the active region 12. In this embodiment, the substrate is a P-channel type substrate for forming an N-channel device.

Figure 2:
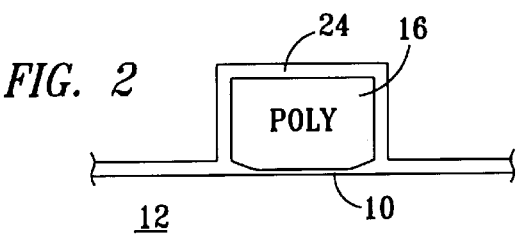
FIG. 2 illustrates the step of forming a layer of oxide over the surface of the poly gate.

In the next step of the process, illustrated in FIG. 2, a layer of oxide 24 is grown on the silicon surface and on the sides and surface of the poly electrode 16. During this step, silicon is consumed to form this oxide layer. This results in the upper surface of the silicon substrate 12 being consumed from the top, such that the surface is lowered slightly, with the lower edges of the poly gate 16 also being consumed. This results in a slight "rounding" of the edges of the poly gate such that the gate oxide at that level is slightly thicker. This sometimes is referred to as the "gate oxide smile". At this point in the process, the poly gate 16 has not been doped. For low voltages transistors, the poly for an NMOS transistor would have already been heavily doped. This would have been achieved by masking off the poly layer for the high voltage transistors and exposing only the active regions for the low voltage transistors and then doping these, as was described in U.S. Pat. No. 5,468,666, which was incorporated herein by reference.

Figure 3:
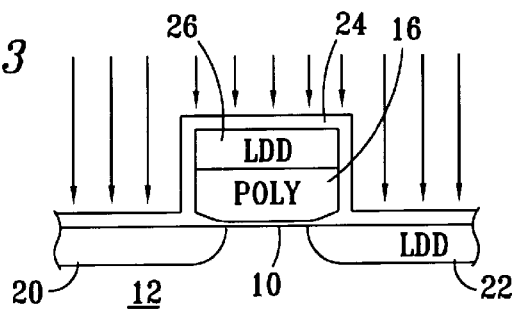
FIG. 3 illustrates the step of performing the LDD implants.

In the next step of the process, as illustrated in FIG. 3, a Lightly Doped Drain (LDD) implant is performed at a $1 \times 10^{13} - 5 \times 10^{14}/cm^2$ dose providing a $2 \times 10^{17}/cm^3 - 10^{19}/cm^3$ concentration. This implant is performed into the poly gate 16 and also into the substrate 12. This step of the process will apply to either a PMOS transistor or an NMOS transistor. This will result in a lightly doped drain region 20 on one side of the gate 16 and a lightly doped drain 22 formed on the other side of the gate 16. In addition, there will be a shallow region 26 of dopants in the upper surface of the gate 16. [In FIG. 2, a layer of oxide 24 will be formed over the sides and upper surface of the poly layer 16.] The LDD implants 20 and 22 extend into the channel regions slightly under the rounded edges of the poly gate 16. This is due to a slight lateral straggle and diff-usion of the dopants that are implanted into the surface of the substrate. As will be described hereinbelow, the LDD implants 20 and 22 provide an extension of later formed source/drain implants into the channel region. However, they are slightly less conductive than the primary source/drain implants.

Figure 4:
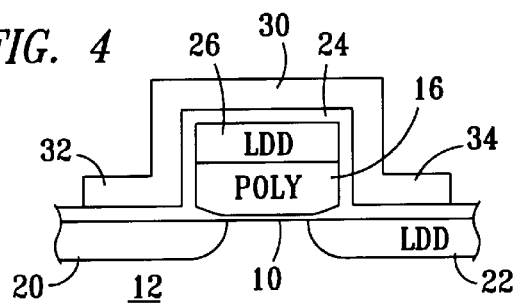
FIG. 4 illustrates the step of forming the spacer over the poly gate electrode.

In the next step of the process as illustrated in FIG. 4, a layer of silicon nitride is deposited over the surface of the substrate to a thickness of approximately 1,000 Angstroms. This layer of silicon nitride is then patterned and etched to provide a "cap" 30 over the gate electrode 16 with two spacers 32 and 34 extending outward from the edge of the electrode 16 by a distance of approximately 0.1–0.2 microns. For low voltage transistors, there would have been no resist above the gate electrode 16 and the same etch process would have removed the added silicon nitride from over the top of the gate electrode 16 and over most of the silicon adjacent thereto while leaving a sidewall spacer of silicon nitride covering the sides of the gate electrode, thus, the cap 30 would have been formed only on the gate electrode 16 associated with the high voltage transistors. The sidewall spacer is always formed in the conventional process which in the present invention is used only as the low voltage transistors.

Figure 5:
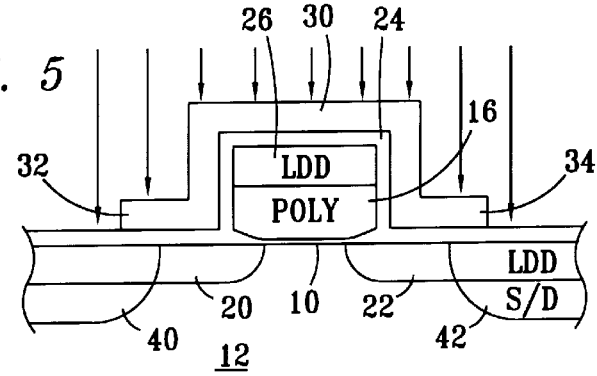
FIG. 5 illustrates the step of performing the source/drain implants.

The next step of the process, as illustrated in FIG. 5, is to form the source/drain implants. This is achieved by implanting N-type dopants into the substrate. However, the nitride cap 30 will prevent the implanted dopants from substantially entering the region underneath the cap 30, including the extensions 32 and 34. This will result in the formation of a source/drain region 40 proximate to the extension 32 and the source/drain region 40 proximate to the extension 34. These source/drain regions will be to a depth of approximately 0.1–0.15 microns. For NMOS transistors, the dopants are typically arsenic or phosphorus in a dose of 1–5 E15/$cm^2$ to provide a concentration of $10^{20}/cm^3$. For PMOS transistors, dopants used are typically boron in a dose of $1-5 \times 10^{15}/cm^2$ to provide a concentration of $10^{20}/cm^3$. As compared to a conventional sidewall oxide or sidewall nitride technique, it can be seen that the extensions 32 and 34 will push the edge of the source/drain junctions 40 and 42 away from the channel region. The sidewall oxide or nitride spacer basically consists of a thickness of the cap 30 of approximately 0.1–0.15 microns plus the thickness of the oxide layer 24 without the extensions 32 and 34. This is a self-aligned process, such that the edge of the source/drain junction is defined by the edge of the sidewall spacer, as compared to the high voltage transistor of the present invention wherein the edge of the source/drain junction is defined by the edge of the extensions 32 and 34. Of course, the LDD implants 20 and 22 provide an extension of the source/drain regions 40 and 42 into the channel regions. Of course, there is a slightly higher resistance associated therewith which essentially disposes a series resistance between the source/drain junctions and the channel region. It is also noted that the cap 30 is not completely impervious to passage of dopants therethrough as a result of the source/drain implant. Some dopants will reach through the extensions 32 and 34 and through the gate oxide layer over the substrate to reach the substrate. However, the concentration of these dopants is minimal. However, the primary purpose of the cap 30 is to prevent a substantial introduction of dopants into the poly gate 16, other than those already introduced as a result of the LDD implant in region 26. Of course, if it is imperative that no dopants are introduced into the silicon gate 16, an additional masking step (not shown) can be utilized to mask off the implant from the poly gate 16. This would only be practical due to the fact that there is a large space between the edge of the gate electrode 16 and the edge of the nitride cap 30 at the most peripheral portions of the extensions 32 and 34. This would allow for a significant misalignment tolerance. It is noted that it may be useful for a small amount of implanted dopants to penetrate the poly gate 12 and improve the conductivity thereof.

Figure 6:
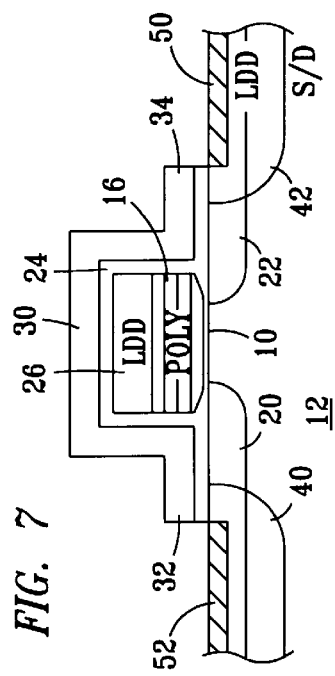
FIG. 6 illustrates the anneal step.

In the next step of the process, as illustrated in FIG. 6, the substrate is subjected to an anneal operation, typically an RTP anneal, a conventional annealing process. The poly gate 16 is illustrated with a plurality of horizontal lines to illustrate the rapid diff-usion in the poly gate 16 as compared to the single crystal silicon that forms the substrate 12. However, since the thickness of the polysilicon gate is substantially thicker than that of the LDD implant after formation thereof, the concentration of the implanted dopant will not be large at the bottom of the gate. Typically, the depth of the LDD junction formed in the substrate will be 0.1 microns or less.

Figure 7:
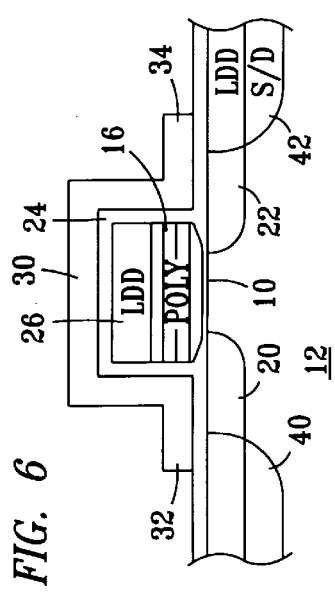
FIG. 7 illustrates the formation of the silicide layer.

In the next step of the process, as illustrated in FIG. 7, a more highly conductive region is formed over the source/drain implants and over the low voltage gates. In this step, a short duration etch is utilized to remove the portion of the thin oxide layer 24 covering the source and drain 40, 42 from all transistors and, in addition, remove the thin oxide from the top of the low voltage transistors which are not covered by the silicon nitride cap 30. After the thin oxide 24 is removed, a thin layer of titanium is deposited and reacted in a nitrogen ambient with the underlying bare silicon or bare polysilicon to form titanium silicide. Of course, other refractory silicides could be utilized. During the reaction in a nitrogen ambient, titanium nitride is formed over the silicon oxide or silicon nitride surface such as layers 30, 32, 34 and over the sidewall spacer formed on the sidewalls of the gate electrode associated with the low voltage transistors (not shown). This titanium nitride is then removed by a wet etch. This results in the formation of the silicide layer 50 overlying the source/drain implant 42 and a layer 52 overlying the source/drain implant 40. Additionally, on the low voltage transistor, the silicide will form over the surface of the exposed gate electrodes.

Figure 8:
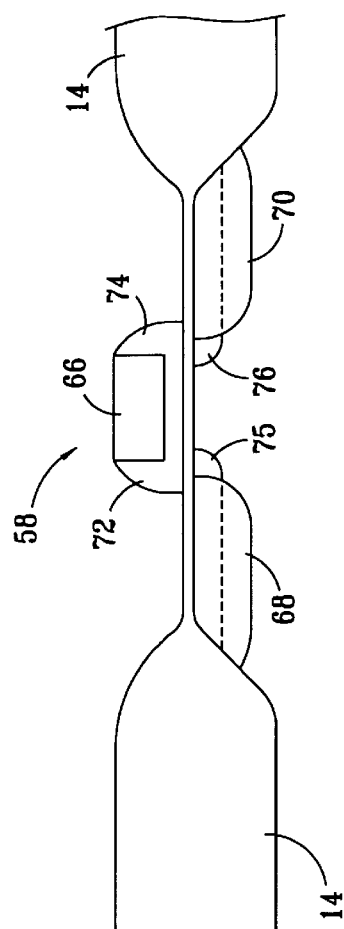
FIG. 8 illustrates a cross sectional diagram of two transistors, a high voltage transistor and a low voltage transistor, fabricated on the same substrate and according to the present invention.
Figure 8:
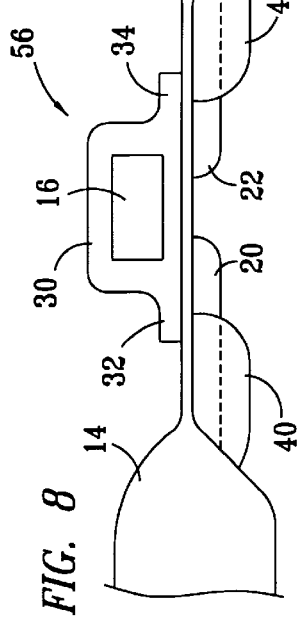

FIG. 8 illustrates a much larger view of the circuit illustrating both a high voltage transistor 56 and a low voltage transistor 58. The low voltage transistor 58 is comprised of a gate electrode 66 having a source/drain implant 68 on one side thereof and a source/drain implant 70 on the other side thereof The gate electrode 66 has sidewall spacers 72 and 74 on either side thereof, this being a conventional configuration. This structure also has LDD regions 75 and 76 which extend laterally slightly beyond the source/drains 68 and 70. The difference between the two devices is that the oxide cap 30 is only disposed over the gate electrode 16 associated with the high voltage transistor 56 and not over the gate electrode 66. As such, the source/drain implant step will not substantially dope the gate 16 of the high voltage transistors. In the case of the high voltage transistors, the gate 16 will be doped only by the LDD implant and, in addition, the length of the LDD in the substrate connecting the source/drain regions with the channel region will be longer than the corresponding LDD length in the low voltage transistor. Since the low voltage transistor does not have a cap 30 to block the source/drain implant from the gate 16, this will result in a higher concentration of dopants in the gate electrode 66 and, as such, the effective gate oxide width will be less than that of the high voltage transistor, due to a lower level of dopants within the gate electrode 16 associated with a high voltage transistor 56.

It is important to note that the cap oxide layer 30 associated with the high voltage transistors is formed from the same layer as that for the sidewall spacers 72 and 74 associated with the high voltage transistors. This is due to the fact that a single layer of oxide or nitride is deposited by a LPCVD process as a conformal layer over the entire substrate and then the "cap regions" of the high voltage transistors are defined with a resist mask. Thereafter, the unmasked portion of the conformal layer is removed with a vertical etch that removes only oxide from substantially horizontal surfaces. This is the conventional process for forming sidewall spacers. Therefore, there is required only an additional step of masking the cap regions to provide for high and low voltage transistors on the same substrate.

Referring back to FIG. 7, it can be seen for the part of the gate that overlies the drain, the effective width may not be as great as that in the center of a channel. This is due to the fact that the gate could be of a value of 0 volts with a drain being at a higher voltage of, for example, +5 V. In this case, the bottom of gate electrode 16 is accumulated and the electrical field in the oxide is not appreciably decreased by depletion. However, the oxide smile illustrated does increase the gate oxide thickness over much of the drain, thereby decreasing the electrical field in the oxide due to the increased thickness thereof on the peripheral edges.

The bottom of the polysilicon gate is always partially depleted when the gate voltage is larger in magnitude than that in the silicon, (positive voltages for NMOS). This covers most cases along the length and width of the gate for all operation conditions. However, when the transistor is turned off with the drain held at the supply voltage, $V_{DD}$, the region directly over the drain will be accumulated rather than inverted such that the advantage provided by the depletion of the bottom of the polysilicon gate will not be present over the drain for this case. However, the drain (and source) are covered by thicker oxide due to the "oxide smile" shown in FIG. 2 under the edges of the poly gate 16, so the electric field is already reduced in this region for all cases.

In summary, there has been provided a process for forming high voltage transistors on a substrate in conjunction with low voltage transistors. The transistors that are determined to be high voltage have a nitride cap disposed over the gate electrodes thereof prior to the step of implanting the source/drain regions. This prevents the select transistors from having the level of dopants associated with a source/drain implant introduced therein. This reduced level of dopants results in a larger depletion region at the oxide/polysilicon boundary, thus increasing the effect of the gate oxide width.

Although the preferred embodiment has been described in detail, it should be understood that various changes, substitutions and alterations can be made therein without departing from the spirit and scope of the invention as defined by the appended claims. The invention could be used without titanium silicide (or titanium disilicide) or could be used with another silicide such as cobalt silicide. In addition, the cap 30 could be made of oxide instead of nitride.

What is claimed is:

1. A process for forming high voltage and low voltage transistors on a single substrate, comprising the steps of:

forming a plurality of gate electrodes for both high voltage and low voltage transistors on the surface of the substrate, each in defined active regions and each overlying a channel region and separated therefrom by a gate oxide layer;

implanting source/drain regions on either side of the gate electrodes of each of the high voltage and low voltage transistors to form source/drain regions; and concurrently with said step of implanting, inhibiting significant introduction of the dopants implanted to the source/drain regions in the step of implanting the source/drain regions only in the ones of the gate electrodes associated with high voltage transistors.

2. The process of claim 1, wherein the step of inhibiting comprises the step of forming a protective cap over the gate electrodes of the ones of the gate electrodes associated with a high voltage transistor prior to the step of implanting.

3. A process for forming high voltage and low voltage transistors on a single substrate, comprising the steps of:

forming a plurality of gate electrodes on the surface of the substrate, each in defined active regions and each overlying a channel region and separated therefrom by a gate oxide layer;

implanting source/drain regions on either side of the gate electrodes to form source/drain regions; and inhibiting significant introduction of the dopants implanted to the source/drain regions in the step of implanting the source/drain regions only in the ones of the gate electrodes associated with high voltage transistors;

wherein the step of forming the protective cap over the gate electrode comprises forming a layer of nitride over the substrate and patterning and etching the nitride layer to form the protective caps only over the gate electrodes of the ones of the gate electrodes associated with high voltage transistors.

4. The process of claim 3, wherein the step of patterning and etching the nitride layer comprises patterning the nitride layer such that an extension of the nitride layer extends outward on either side of the gate electrodes associated with a high voltage transistor such that the sidewalls of the gate electrode associated with the high voltage transistors are covered and a portion of the substrate extending outward from the gate electrode associated with the high voltage transistors has nitride disposed thereover, wherein the step of implanting the source/drain regions results in source/drain regions being spaced outward from the gate electrodes associated with the high voltage transistors.

5. The process of claim 3, wherein the step of forming the nitride layer is preceded by the step of forming a layer of oxide over the gate electrodes for all of the transistors.

6. The process of claim 1 and further comprising the step of forming a conductive layer over the source/drain regions and the upper surface of the gate electrodes associated with the low voltage transistors to improve the conductivity thereof.

7. The process of claim 6, wherein the step of forming the conductive layer comprises forming a refractory metal silicide layer.

8. The process of claim 1 and further comprising forming a lightly doped drain implant into the substrate prior to performing the step of implanting the source/drain regions wherein the step of implanting the source/drain regions on either side of the electrodes to form the source/drain regions of the transistor comprises spacing the source/drain regions away from the edge of the gate electrodes and connected to the channel region by the lightly doped drain implant.

9. A process for forming high voltage and low voltage transistors on a single substrate, comprising the steps of:

forming a plurality of gate electrodes on the surface of the substrate, each in defined active regions and each overlying a channel region and separated therefrom by a gate oxide layer;

implanting source/drain regions on either side of the gate electrodes to form source/drain regions; and inhibiting significant introduction of the dopants implanted to the source/drain regions in the step of implanting the source/drain regions only in the ones of the gate electrodes associated with high voltage transistors;

wherein the step of forming the protective cap over the gate electrode comprises the steps of:

depositing a conformal layer of insulating material over the substrate to cover both the gate electrodes of the transistors designated as high voltage transistors and the gate electrodes of the transistors designated as low voltage transistors;

forming a mask over the layer of insulating material such that the mask covers the gate electrodes underlying the conformal layer of insulating material and associated with the high voltage transistors;

removing the unmasked portion of the conformal insulating layer such that sidewall spacers are formed on either side of the gate electrodes associated with the low voltage transistors and the upper surfaces of the gate electrodes are exposed; and removing the mask layer such that a cap of insulating material remains over the gate electrodes associated with the high voltage transistors.

10. The process of claim 9, wherein the insulating layer is a nitride layer.

11. The process of claim 1, and further comprising expanding the gate oxide layer thickness at the longitudinal edges of the channel region.

12. A process for forming high voltage and low voltage transistors on a single substrate, each of the transistors comprised of a gate electrode overlying a channel region and separated therefrom by a gate oxide layer with the source/drain regions implanted on either side of the respective gate regions in a self-aligned process, the high voltage transistors formed by substantially inhibiting dopants from entering the gate electrodes associated with the high voltage transistors during the concurrent source/drain implant operation for each of the low voltage and high voltage transistors while allowing dopants to be introduced into the gate electrodes associated with the low voltage transistors during the source/drain implant operation.

* * * * *